US009825184B2

(12) United States Patent
Hayashi

(10) Patent No.: US 9,825,184 B2
(45) Date of Patent: Nov. 21, 2017

(54) NON-VOLATILE SEMICONDUCTOR MEMORY DEVICE

(71) Applicant: Toshiba Memory Corporation, Minato-ku (JP)

(72) Inventor: Takashi Hayashi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 8 days.

(21) Appl. No.: 15/019,331

(22) Filed: Feb. 9, 2016

(65) Prior Publication Data

US 2017/0062621 A1  Mar. 2, 2017

Related U.S. Application Data

(60) Provisional application No. 62/211,496, filed on Aug. 28, 2015.

(51) Int. Cl.
*H01L 29/792* (2006.01)
*H01L 29/788* (2006.01)
*H01L 29/51* (2006.01)

(52) U.S. Cl.
CPC ........ *H01L 29/7883* (2013.01); *H01L 29/513* (2013.01); *H01L 29/517* (2013.01); *H01L 29/518* (2013.01)

(58) Field of Classification Search
CPC ............. H01L 29/792; H01L 27/11563; H01L 29/4234; H01L 29/66833; H01L 27/11558;

(Continued)

(56) References Cited

U.S. PATENT DOCUMENTS 7,956,406 B2   6/2011  Yasuda
8,013,380 B2   9/2011  Nakasaki et al.
(Continued)

FOREIGN PATENT DOCUMENTS

JP   2009-81203    4/2009
JP   2009-81316    4/2009
JP   2009-170929   7/2009

OTHER PUBLICATIONS

S. Shamuilia, et al., "Photoconductivity of Hf-based binary metal oxide systems", Journal of Applied Physics, Article No. 114103, vol. 104, 2008, 2 pgs.

(Continued)

*Primary Examiner* — Mary Wilczewski
*Assistant Examiner* — Tsz Chiu
(74) *Attorney, Agent, or Firm* — Oblon, McClelland, Maier & Neustadt, L.L.P.

(57) ABSTRACT

According to one embodiment, an inter-electrode insulating film interposed between a floating gate electrode and a control gate electrode includes a lower layer insulating film disposed on a side closer to the floating gate electrode, an upper layer insulating film disposed on a side closer to the control gate electrode, and an intermediate insulating film interposed between the lower layer insulating film and the upper layer insulating film, wherein the intermediate insulating film contains a first element, and the lower layer insulating film contains the first element and a second element, such that a ratio of the first element relative to the second element is larger on a side closer to the intermediate insulating film than on a side closer to the floating gate electrode.

16 Claims, 8 Drawing Sheets

(58) Field of Classification Search
CPC ......... H01L 29/42328; H01L 27/11517; H01L 29/42324; H01L 2924/01072
See application file for complete search history.

(56) References Cited

U.S. PATENT DOCUMENTS

| | | | | |
|---|---|---|---|---|
| 8,426,909 | B2 * | 4/2013 | Yasuda | ............. H01L 21/28282 257/324 |
| 9,041,145 | B2 * | 5/2015 | Kawashima | ........ H01L 29/4234 257/506 |
| 9,379,256 | B2 * | 6/2016 | Yasuda | ............. H01L 21/28282 |
| 2004/0004242 | A1 * | 1/2004 | Yamamoto | ........ H01L 21/28185 257/310 |
| 2005/0006696 | A1 * | 1/2005 | Noguchi | ............... H01L 27/115 257/316 |
| 2008/0194066 | A1 * | 8/2008 | Weimer | ........... H01L 21/28273 438/257 |
| 2008/0296653 | A1 * | 12/2008 | Ozawa | ............. H01L 21/28273 257/316 |
| 2009/0152618 | A1 * | 6/2009 | Matsuo | ................ H01L 27/115 257/324 |
| 2015/0372228 | A1 * | 12/2015 | Chiang | .................. H01L 45/08 257/2 |

OTHER PUBLICATIONS

V. V. Afanas'Ev, et al., "Photoconductivity of metal oxide nanolayers", Semiconductor Physics Laboratory HF University of Leuven, 2007, 16 pgs.

* cited by examiner

NON-VOLATILE SEMICONDUCTOR MEMORY DEVICE

CROSS-REFERENCE TO RELATED APPLICATIONS

This application is based upon and claims the benefit of priority from U.S. Provisional Application No. 62/211,496, filed on Aug. 28, 2015; the entire contents of which are incorporated herein by reference.

FIELD

Embodiments described herein relate generally to a non-volatile semiconductor memory device.

BACKGROUND

As regards non-volatile semiconductor memory devices, there is a method in which a high-dielectric film is used as an inter-electrode insulating film to address miniaturization of memory cells.

DETAILED DESCRIPTION

In general, according to one embodiment, a non-volatile semiconductor memory device includes a tunnel insulating film disposed on a semiconductor substrate, a floating gate electrode disposed on the tunnel insulating film, an inter-electrode insulating film disposed on the floating gate electrode, and a control gate electrode disposed on the inter-electrode insulating film. The inter-electrode insulating film includes a lower layer insulating film disposed on a side closer to the floating gate electrode, an upper layer insulating film disposed on a side closer to the control gate electrode, and an intermediate insulating film interposed between the lower layer insulating film and the upper layer insulating film. The intermediate insulating film contains a first element. The lower layer insulating film contains the first element and a second element, such that a ratio of the first element relative to the second element is larger on a side closer to the intermediate insulating film than on a side closer to the floating gate electrode.

Exemplary embodiments of a non-volatile semiconductor memory device will be explained below in detail with reference to the accompanying drawings. The present invention is not limited to the following embodiments.

First Embodiment

Figure 1:
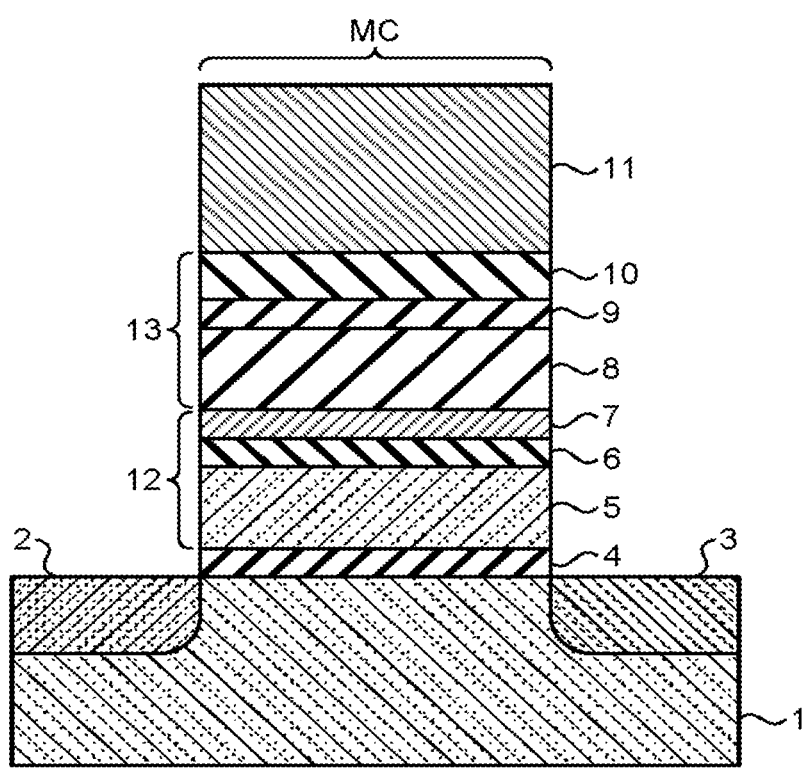
FIG. 1 is a sectional view showing the configuration of a memory cell, which is applied to a non-volatile semiconductor memory device according to a first embodiment.

FIG. 1 is a sectional view showing the configuration of a memory cell, which is applied to a non-volatile semiconductor memory device according to a first embodiment.

As shown in FIG. 1, a semiconductor substrate 1 is provided with impurity diffusion layers 2 and 3 formed therein. The impurity diffusion layers 2 and 3 may respectively be used as a source layer and a drain layer. In the semiconductor substrate 1, a channel layer may be formed between the impurity diffusion layers 2 and 3. As the material of the semiconductor substrate 1, for example, Si, Ge, SiGe, GaAs, GaAlAs, InP, GaP, GaN, SiC, or InGaAsP may be used. A tunnel insulating film 4 is disposed on the channel layer of the semiconductor substrate 1. As the material of the tunnel insulating film 4, for example, $SiO_2$ may be used. The film thickness of the tunnel insulating film 4 may be set to 6 nm or less.

A floating gate electrode 12 is disposed on the tunnel insulating film 4. The floating gate electrode 12 may be formed in a three-layer structure. In this case, the floating gate electrode 12 may be composed of a lower layer film 5, an intermediate film 6, and an upper layer film 7. The lower layer film 5 is present on the side closer to the tunnel insulating film 4. As the material of the lower layer film 5, a semiconductor may be used. For example, a material containing, e.g., Si as the main component may be used for the lower layer film 5. In this case, the lower layer film 5 may be doped with an impurity, such as P. The film thickness of the lower layer film 5 may be set to 4 nm or more. The upper layer film 7 is present on the side closer to an inter-electrode insulating film 13. The material of the upper layer film 7 may be selected such that it has a larger potential depth with respect to the charge accumulated in the floating gate electrode 12, as compared with the lower layer film 5. In this case, as the material of the upper layer film 7, a metal may be used. For example, as the material of the upper layer film 7, Ru or the like may be used. In place of Ru, Ti, Ta, Pt, Ir, or W may be used as the material of the upper layer film 7. Further, a conductive nitride, such as TiN or TaN, may be used as the material of the upper layer film 7.

The intermediate film 6 is interposed between the lower layer film 5 and the upper layer film 7. The material of the intermediate film 6 may be selected such that it has a smaller diffusion constant of a metal contained in the upper layer film 7, as compared with the lower layer film 5. In this case, the intermediate film 6 may be used as a film for preventing diffusion of the metal contained in the upper layer film 7. Further, the material of the intermediate film 6 may be selected such that it does not have a property of oxidizing the metal contained in the upper layer film 7. For example, as the material of the intermediate film 6, SiN or the like may be used.

The inter-electrode insulating film 13 is disposed on the floating gate electrode 12. The inter-electrode insulating film 13 may be formed in a three-layer structure. In this case, the inter-electrode insulating film 13 may be composed of a lower layer insulating film 8, an intermediate insulating film 9, and an upper layer insulating film 10. The material of each of the lower layer insulating film 8 and the upper layer insulating film 10 may be selected such that it has a dielectric constant higher than that of the intermediate insulating film 9. The film thickness of each of the lower layer insulating film 8, the intermediate insulating film 9, and the upper layer insulating film 10 may be set to 10 nm or less. In this case, the intermediate insulating film 9 may be made to have a larger barrier height with respect to the charge accumulated in the floating gate electrode 12, as compared with the lower layer insulating film 8 and the upper layer insulating film 10.

The intermediate insulating film 9 may contain a first element. As the first element, for example, Si or Al may be used. In this case, as the material of the intermediate insulating film 9, an oxide of the first element may be used. The lower layer insulating film 8 and the upper layer insulating film 10 may contain the first element and a second element. As the second element, for example, Hf, Zr, Ta, Y, La, or Ti may be used. In this case, as the material of each of the lower layer insulating film 8 and the upper layer insulating film 10, a compound oxide of the first element and the second element may be used. Here, the compound oxide of the first element and the second element may have a crystal structure. In this crystal structure, the metal element contained in the upper layer film 7 has a capability of substitution for the first element higher than for the second element. Further, the lower layer insulating film 8 may be made such that its ratio of the first element relative to the second element is larger on the side closer to the intermediate insulating film 9 than on the side closer to the floating gate electrode 12. The ratio may be a ratio of the number of atoms of the element.

In this case, the lower layer insulating film 8 may be arranged such that its part on the side closer to the intermediate insulating film 9 has a lattice constant closer to that of the intermediate insulating film 9, and has a larger diffusion constant of the metal element contained in the upper layer film 7, as compared with its part on the side closer to the floating gate electrode 12.

For example, as the material of the intermediate insulating film 9, $SiO_x$ ("x" is a positive real number) may be used. In this case, as the material of each of the lower layer insulating film 8 and the upper layer insulating film 10, $HfSiO_x$ may be used. Further, the lower layer insulating film 8 may be made to have a ratio of Si relative to Hf such that the ratio is larger on the side closer to the intermediate insulating film 9 than on the side closer to the floating gate electrode 12.

Alternatively, as the material of the intermediate insulating film 9, $Al_2O_3$ may be used. In this case, as the material of each of the lower layer insulating film 8 and the upper layer insulating film 10, $Hf_{1-x}Al_xO_y$ (each of "x" and "y" is a positive real number) may be used. Further, the lower layer insulating film 8 may be made to have a ratio of Al relative to Hf such that the ratio is larger on the side closer to the intermediate insulating film 9 than on the side closer to the floating gate electrode 12.

A control gate electrode 11 is disposed on the inter-electrode insulating film 13. As the material of the control gate electrode 11, for example, W or WN may be used.

A memory cell MC is constituted by providing the tunnel insulating film 4, the floating gate electrode 12, the inter-electrode insulating film 13, and the control gate electrode 11 onto the semiconductor substrate 1. In this case, the floating gate electrode 12 is divided into parts corresponding to respective memory cells MC. Further, the memory cells MC are arranged in a matrix format defined by the direction of rows and the direction of columns, so that a memory cell array is formed. In this case, each control gate electrode 11 may be used as a word line. Further, each control gate electrode 11 may be shared by a plurality of memory cells MC belonging to the same row.

Figure 2A:
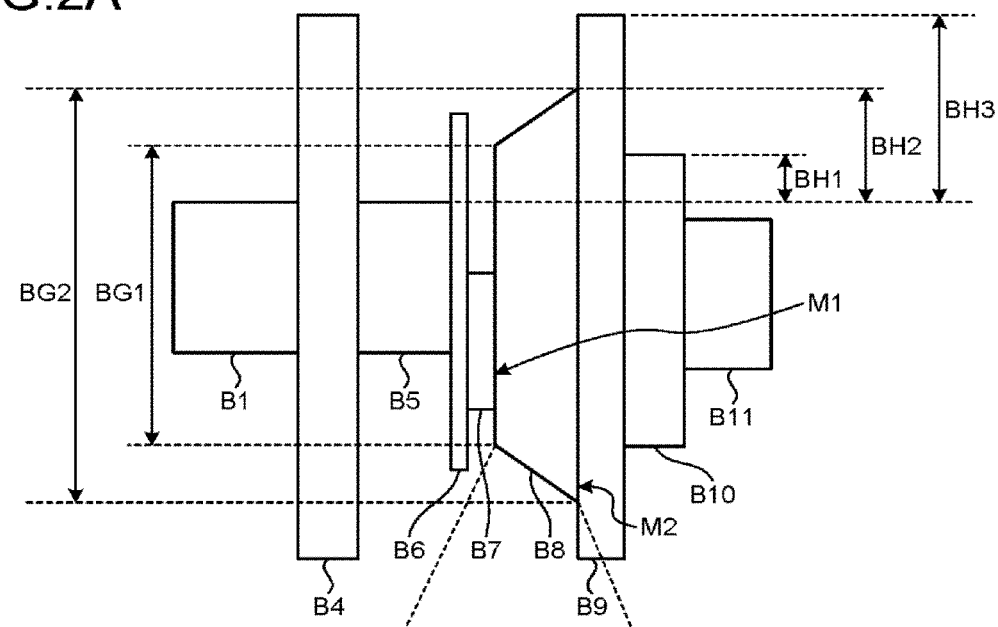
FIG. 2A is a view showing an energy band structure of the memory cell, which is applied to the non-volatile semiconductor memory device according to the first embodiment, obtained when no external electric field is applied.
Figure 2B:
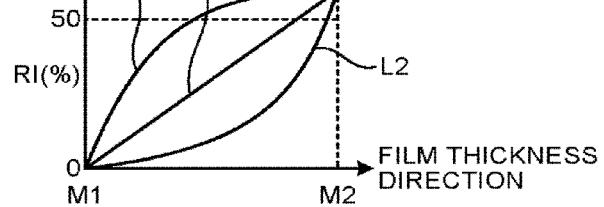
FIG. 2B is a view showing a composition distribution inside a lower layer insulating film shown in FIG. 1 in the film thickness direction.

FIG. 2A is a view showing an energy band structure of the memory cell, which is applied to the non-volatile semiconductor memory device according to the first embodiment, obtained when no external electric field is applied, and FIG. 2B is a view showing a composition distribution inside the lower layer insulating film shown in FIG. 1 in the film thickness direction.

As shown in FIG. 2A, the semiconductor substrate 1 has an energy band B1. The tunnel insulating film 4 has an energy band B4. The lower layer film 5 has an energy band B5. The intermediate film 6 has an energy band B6. The upper layer film 7 has an energy band B7. The lower layer insulating film 8 has an energy band B8. The intermediate insulating film 9 has an energy band B9. The upper layer insulating film 10 has an energy band B10. The control gate electrode 11 has an energy band B11.

The energy band B7 has a potential deeper than that of the energy band B5 with respect to the charge accumulated in the floating gate electrode 12. The barrier height BH3 of the intermediate insulating film 9 is larger than the barrier height BH2 of the lower layer insulating film 8 and the barrier height BH1 of the upper layer insulating film 10, with respect to the charge accumulated in the floating gate electrode 12. Here, in FIG. 2A, the barrier heights BH1 to BH3 respectively represent the energy levels of the respective conduction band ends of the upper layer insulating film 10, the lower layer insulating film 8, and the intermediate insulating film 9, relative to the energy level of the conduction band end of the semiconductor substrate 1 obtained when the energy band is flat.

In the energy band B8, the band gap BG2 at the interface M2 with the intermediate insulating film 9 is larger than the band gap BG1 at the interface M1 with the upper layer film 7. In this case, the band gap of the energy band B8 may be set to continuously increase in the direction from the interface M1 with the upper layer film 7 to the interface M2 with the intermediate insulating film 9. In order to provide the energy band B8 with such a band gap, the ratio RI of the first element relative to the second element, contained in the lower layer insulating film 8, may be set to continuously increase in the direction from the interface M1 to the interface M2, as shown in FIG. 2B. This ratio RI may be set to increase along a straight line L1, or may be set to increase along a curved line L2 or L3.

For example, a curved line L2 may be formed of a multi-order curve or exponential curve, and the curved line L3 may be formed of a logarithmic curve. In this case, the lower layer insulating film 8 may be made such that the ratio RI of the first element relative to the second element is 0% at the interface M1 and the ratio RI of the first element relative to the second element is 50% or more at the interface M2. For example, in the case of the lower layer insulating film 8 made of $HfSiO_x$, the lower layer insulating film 8 may be made such that the ratio RI of Si relative to Hf is 0% at the interface M1 and the ratio RI of Si relative to Hf is 50% or more at the interface M2.

Figure 3A:
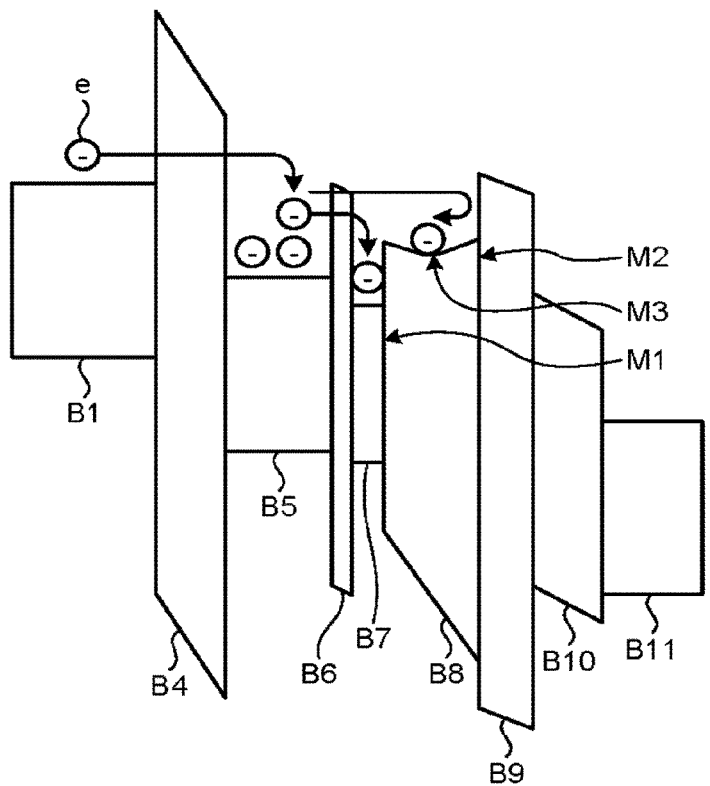
FIG. 3A is a view showing an energy band structure of the memory cell, which is applied to the non-volatile semiconductor memory device according to the first embodiment, obtained when writing is performed.
Figure 3B:
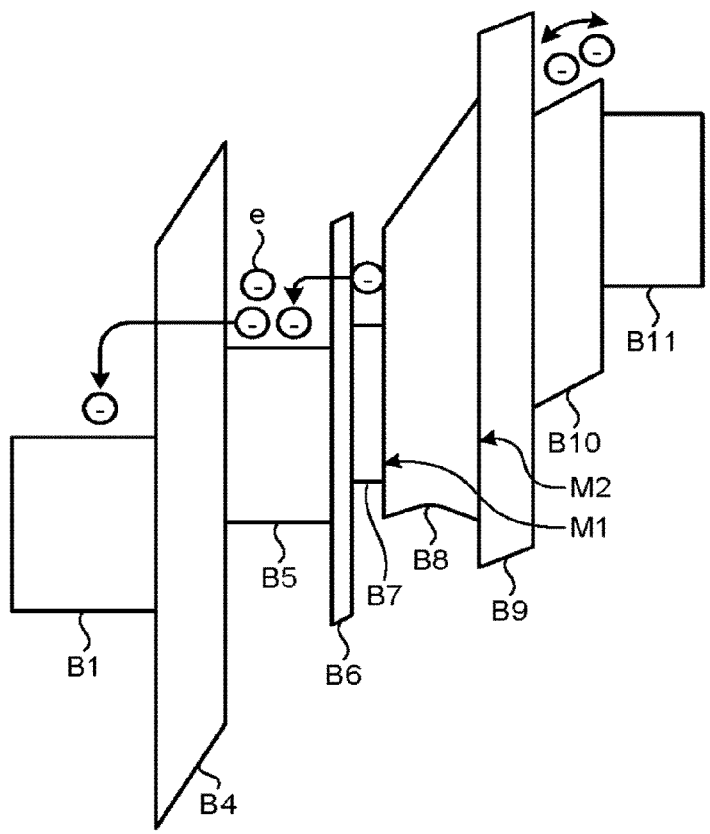
FIG. 3B is a view showing an energy band structure of the memory cell, which is applied to the non-volatile semiconductor memory device according to the first embodiment, obtained when erasing is performed.

FIG. 3A is a view showing an energy band structure of the memory cell, which is applied to the non-volatile semiconductor memory device according to the first embodiment, obtained when writing is performed, and FIG. 3B is a view showing an energy band structure of the memory cell, which is applied to the non-volatile semiconductor memory device according to the first embodiment, obtained when erasing is performed.

As shown in FIG. 3A, when writing is performed to the memory cell, the control gate electrode 11 is supplied with a positive voltage relative to the semiconductor substrate 1. At this time, a charge "e" in the semiconductor substrate 1 passes through the tunnel insulating film 4 by means of a tunnel effect, and is accumulated into the lower layer film 5. Further, part of the charge "e" having passed through the tunnel insulating film 4 passes through the intermediate film 6 by means of a tunnel effect, and is accumulated into the upper layer film 7.

Here, the energy band B7 is set to have a potential deeper than that of the energy band B5 with respect to the charge "e", so that the charge "e" accumulated in the floating gate electrode 12 can hardly migrate into the inter-electrode insulating film 13, and leakage of the charge "e" accumulated in the floating gate electrode 12 can thereby be reduced. Further, the intermediate film 6 is made of a material having no property of oxidizing metals, so that the metal contained in the upper layer film 7 can hardly be oxidized, and the upper layer film 7 can thereby be suppressed from becoming fragile.

Further, the lower layer insulating film 8 is made such that the ratio RI of the first element relative to the second element is 0% at the interface M1, so that the metal contained in the upper layer film 7 can hardly diffuse into the lower layer insulating film 8. Consequently, an increase of trap sites in the lower layer insulating film 8 can be suppressed, and a shift of the threshold voltage of the memory cell can be reduced. For example, in the case that the metal contained in the upper layer film 7 is Ru and the material of the lower layer insulating film 8 is $HfSiO_x$, since Ru can easily substitute for Si, if the ratio of Si relative to Hf is larger in $HfSiO_x$, Ru becomes apt to diffuse into the lower layer insulating film 8. Accordingly, the lower layer insulating film 8 is made such that the ratio of Si relative to Hf in $HfSiO_x$ is 0% at the interface M1, so that Ru can hardly diffuse into the lower layer insulating film 8, and an increase of trap sites in the lower layer insulating film 8 can be suppressed.

Further, the lower layer insulating film 8 is made such that the ratio RI of the first element relative to the second element is 50% or more at the interface M2, so that the lattice constant of the lower layer insulating film 8 can become closer to the lattice constant of the intermediate insulating film, as compared with the interface M1 of the lower layer insulating film 8. Consequently, defects in the lower layer insulating film 8 can be reduced at the interface M2, and the level of the lower layer insulating film 8 can be reduced at the interface M2, so that leakage of the charge "e" accumulated in the floating gate electrode 12 can thereby be reduced. For example, in the case that the material of the lower layer insulating film 8 is $HfSiO_x$ and the material of the intermediate insulating film 9 is $SiO_x$, if the ratio of Si relative to Hf is smaller in $HfSiO_x$, the lattice mismatch between the lower layer insulating film 8 and the intermediate insulating film 9 becomes larger.

Accordingly, the lower layer insulating film 8 is made such that the ratio of Si relative to Hf in $HfSiO_x$ is 50% or more at the interface M2, so that the lattice mismatch between the lower layer insulating film 8 and the intermediate insulating film 9 can be smaller, and leakage of the charge "e" accumulated in the floating gate electrode 12 can thereby be reduced. Further, since the lower layer insulating film 8 is made such that the ratio RI of the first element relative to the second element is 50% or more at the interface M2, the band gap BG2 of the lower layer insulating film 8 at the interface M2 can be larger than the band gap BG1 of the lower layer insulating film 8 at the interface M1. Consequently, when writing is performed to the memory cell, the potential of the lower layer insulating film 8 at an intermediate position M3 between the interfaces M1 and M2 can be deeper than the potentials at the interfaces M1 and M2. In this case, a charge "e" can hardly be accumulated at the interface M2 of the lower layer insulating film 8, and leakage of the charge "e" accumulated in the floating gate electrode 12 can thereby be reduced.

Further, the lower layer insulating film 8 is made such that the ratio RI of the first element relative to the second element contained therein continuously increases in the direction from the interface M1 to the interface M2, so that the lattice constant of the lower layer insulating film 8 can be prevented from drastically changing in the film thickness direction. Consequently, an increase of defects in the lower layer insulating film 8 can be suppressed, and an increase of trap sites in the lower layer insulating film 8 can be suppressed.

Further, the barrier height BH3 of the intermediate insulating film 9 is set higher than the barrier height BH2 of the lower layer insulating film 8, so that a charge "e" having entered the lower layer insulating film 8 can be prevented from migrating into the control gate electrode 11, and leakage of a charge "e" from the floating gate electrode 12 into the control gate electrode 11 can thereby be reduced.

As shown in FIG. 3B, when erasing is performed to the memory cell, the control gate electrode 11 is supplied with a negative voltage relative to the semiconductor substrate 1. At this time, a charge "e" accumulated in the upper layer film 7 passes through the intermediate film 6 by means of a tunnel effect, and is exhausted into the lower layer film 5. Further, a charge "e" accumulated in the lower layer film 5 passes through the tunnel insulating film 4 by means of a tunnel effect, and is exhausted into the semiconductor substrate 1.

Here, the lower layer film 5 is disposed between the tunnel insulating film 4 and the upper layer film 7, so that the erasing efficiency of the memory cell can be improved, as compared with a case excluding the lower layer film 5.

Further, the barrier height BH3 of the intermediate insulating film 9 is set higher than the barrier height BH1 of the upper layer insulating film 10, so that a charge "e" having entered the upper layer insulating film 10 can be prevented from migrating into the floating gate electrode 12, and leakage of a charge "e" from the control gate electrode 11 into the semiconductor substrate 1 can thereby be reduced.

Second Embodiment

Figure 4A:
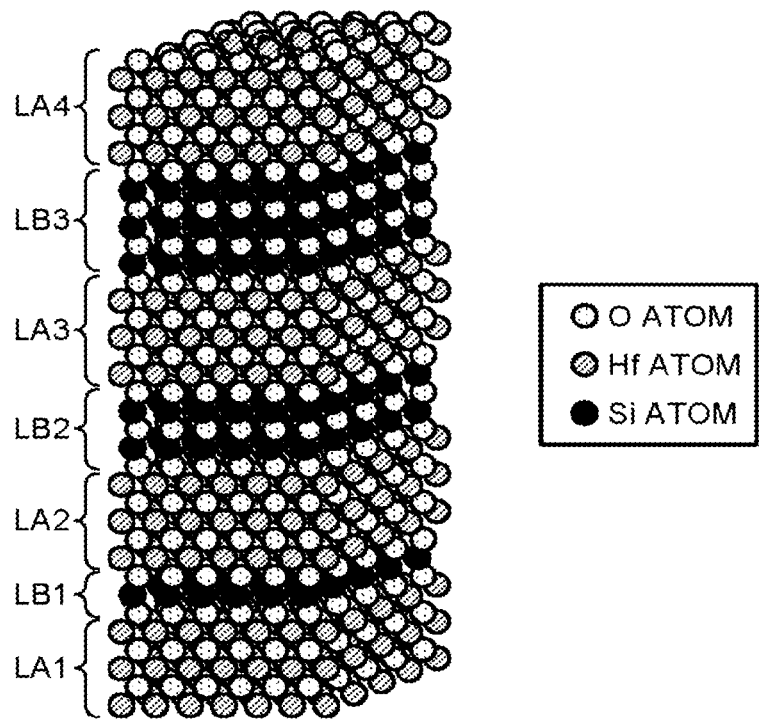
FIGS. 4A and 4B are sectional views showing a method of manufacturing a lower layer insulating film, which is applied to a non-volatile semiconductor memory device according to a second embodiment.
Figure 4B:
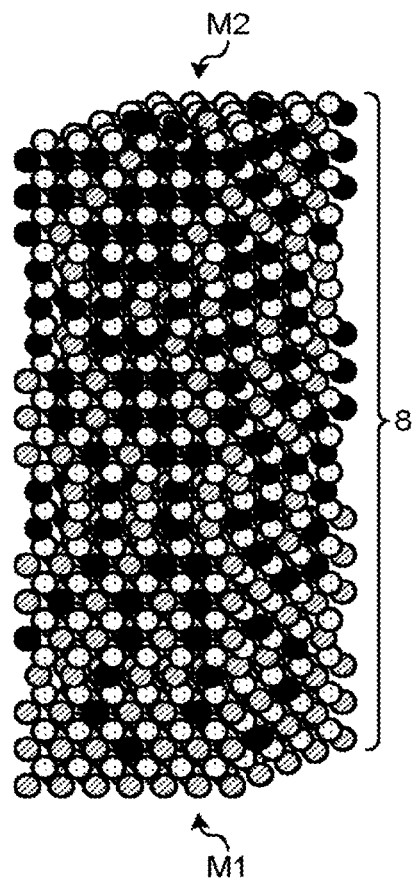

FIGS. 4A and 4B are sectional views showing a method of manufacturing a lower layer insulating film, which is applied to a non-volatile semiconductor memory device according to a second embodiment. Here, in this embodiment, an explanation will be given of a case that the lower layer insulating film 8 is formed of HfSiO$_x$.

As shown in FIG. 4A, an HfO$_x$ layer LA1 is formed by use of ALD (Atomic Layer Deposition). At this time, the HfO$_x$ layer LA1 may be formed by stacking three layers of Hf atoms. Then, an SiO$_x$ layer LB1 is formed onto the HfO$_x$ layer LA1 by use of ALD. The SiO$_x$ layer LB1 may be formed by stacking one layer of O atoms. Then, an HfO$_x$ layer LA2 is formed onto the SiO$_x$ layer LB1 by use of ALD. At this time, the HfO$_x$ layer LA2 may be formed by stacking three layers of Hf atoms. Then, an SiO$_x$ layer LB2 is formed onto the HfO$_x$ layer LA2 by use of ALD. The SiO$_x$ layer LB2 may be formed by stacking two layers of O atoms. Then, an HfO$_x$ layer LA3 is formed onto the SiO$_x$ layer LB2 by use of ALD. At this time, the HfO$_x$ layer LA3 may be formed by stacking three layers of Hf atoms.

Then, an SiO$_x$ layer LB3 is formed onto the HfO$_x$ layer LA3 by use of ALD. The SiO$_x$ layer LB3 may be formed by stacking three layers of O atoms. Then, an HfO$_x$ layer LA4 is formed onto the SiO$_x$ layer LB3 by use of ALD. At this time, the HfO$_x$ layer LA4 may be formed by stacking three layers of Hf atoms. Thereafter, in the same way, an HfO$_x$ layer and an SiO$_x$ layer are alternately stacked. At this time, it may be set such that the number of layers of O atoms for forming each SiO$_x$ layer is gradually increased while the number of layers of Hf atoms for forming each HfO$_x$ layer is kept constant.

Then, as shown in FIG. 4B, the stacked structure of HfO$_x$ layers and SiO$_x$ layers is subjected to a heat process, and Hf atoms and Si atoms are thereby caused to diffuse. Here, the temperature and time of the heat process are optimized, such that the composition distribution of Si atoms can have continuity in the film thickness direction.

Here, as compared with an Hf atom, an Ru atom can more easily substitute for an Si atom. Accordingly, even if Ru atoms are present at the interface M1, since Si atoms are not present at the interface M1, Ru atoms can hardly diffuse into the lower layer insulating film 8, so that an increase of trap sites in the lower layer insulating film 8 can be suppressed.

It should be noted that, in the embodiment described above, the lower layer insulating film 8 having a composition distribution of Si in HfSiO$_x$ in the film thickness direction is formed by a method using ALD, but the same film may be formed by a method using CVD. In this case, for example, film formation of HfO$_2$ is performed by 1 nm, and then film formation of HfSiO having an Si composition of 10% is performed by 1 nm. Then, film formation of HfO$_2$ is performed by 1 nm, and then film formation of HfSiO having an Si composition of 20% is performed by 1 nm. Then, film formation of HfO$_2$ is performed by 1 nm, and then film formation of HfSiO having an Si composition of 30% is performed by 1 nm. Then, film formation of HfO$_2$ is performed by 1 nm, and then film formation of HfSiO having an Si composition of 40% is performed by 1 nm. Then, film formation of HfO$_2$ is performed by 1 nm, and then film formation of HfSiO having an Si composition of 50% is performed by 1 nm. Thereafter, the stacked structure of HfO$_2$ layers and HfSiO layers respectively having different Si compositions is subjected to a heat process, and Si is thereby caused to diffuse, such that the composition distribution of Si can have continuity in the film thickness direction.

Third Embodiment

Figure 5:
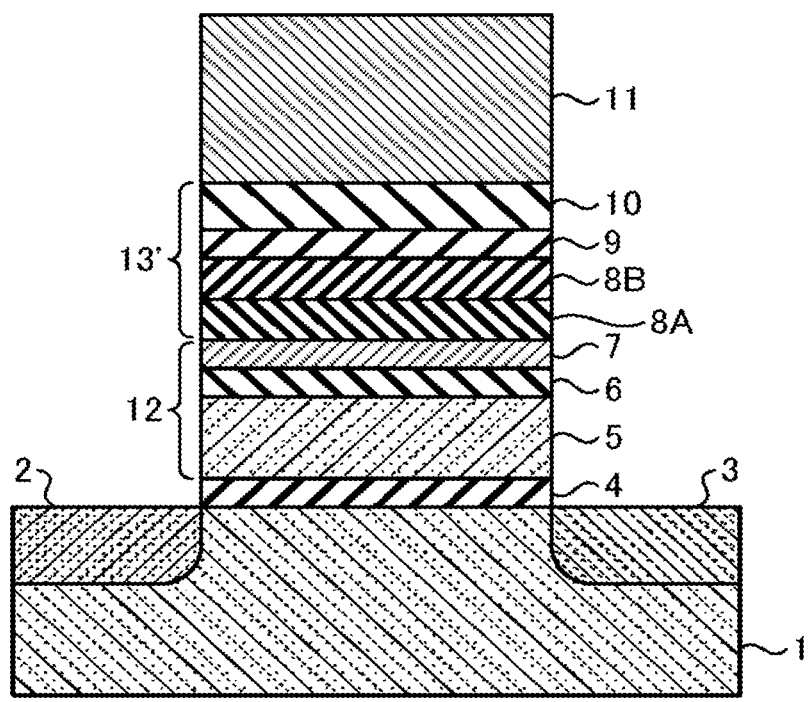
FIG. 5 is a sectional view showing the configuration of a memory cell, which is applied to a non-volatile semiconductor memory device according to a third embodiment.

FIG. 5 is a sectional view showing the configuration of a memory cell, which is applied to a non-volatile semiconductor memory device according to a third embodiment.

As shown in FIG. 5, in this configuration, an inter-electrode insulating film 13' is disposed in place of the inter-electrode insulating film 13 shown in FIG. 1. The inter-electrode insulating film 13' includes lower layer insulating films 8A and 8B in place of the lower layer insulating film 8 shown in FIG. 1. The lower layer insulating film BA has a smaller diffusion constant of the metal element contained in the upper layer film 7, as compared with the lower layer insulating film 8B. In this case, the lower layer insulating film 8A may be used as a diffusion prevention film for preventing diffusion of the metal element contained in the upper layer film 7 into the inter-electrode insulating film 13'. The lower layer insulating film 8B has a lattice constant closer to that of the intermediate insulating film 9, as compared with the lower layer insulating film BA. In this case, the lower layer insulating film 8B may be used as a buffer film for reducing the lattice mismatch with the intermediate insulating film 9.

Here, as the material of each of the lower layer insulating films 8A and 8B, a compound oxide of a first element and a second element may be used. In this case, the lower layer insulating film 8B may be made such that the ratio of the first element relative to the second element is larger than that of the lower layer insulating film 8A. For example, as the material of each of the lower layer insulating films 8A and 8B, HfSiO$_x$ may be used. Further, the lower layer insulating film 8B may be made such that the ratio of Si relative to Hf is larger than that of the lower layer insulating film 8A. HfO may be used for the lower layer insulating film 8A, and HfSiO$_x$ may be used for the lower layer insulating film 8B.

Figure 6:
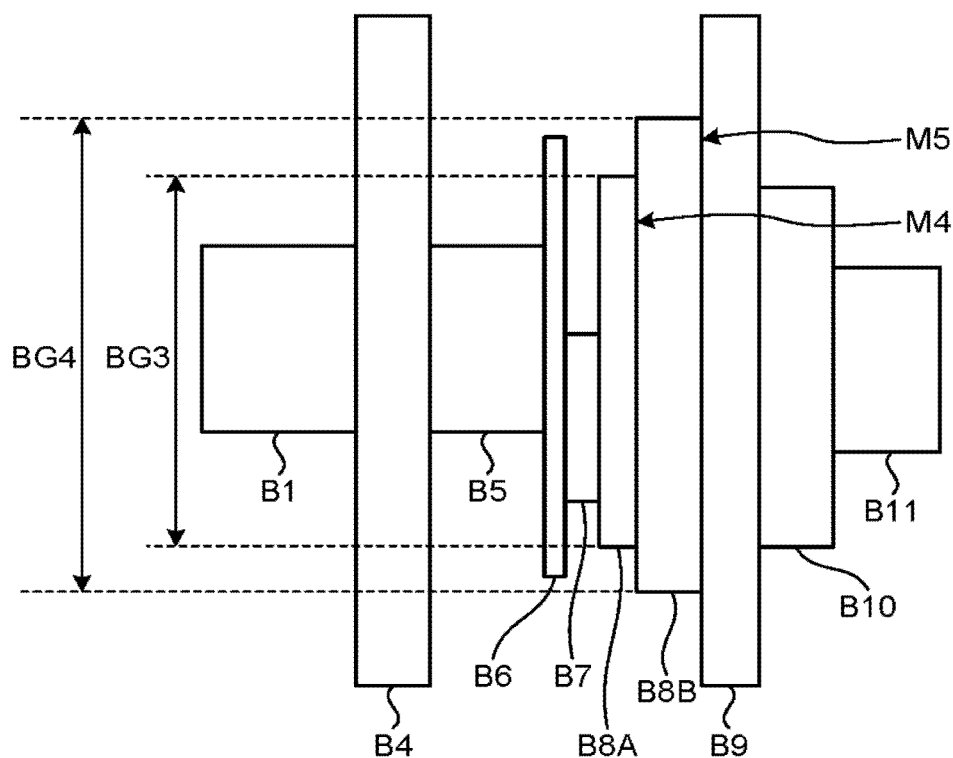
FIG. 6 is a view showing an energy band structure of the memory cell, which is applied to the non-volatile semiconductor memory device according to the third embodiment, obtained when no external electric field is applied.

FIG. 6 is a view showing an energy band structure of the memory cell, which is applied to the non-volatile semiconductor memory device according to the third embodiment, obtained when no external electric field is applied.

As shown in FIG. 6, the lower layer insulating film 8A has an energy band B8A. The lower layer insulating film 8B has an energy band B8B. The other parts of the energy band structure are the same as those shown in FIG. 2A. The band gap BG4 of the energy band B8B may be set larger than the band gap BG3 of the energy band B8A. Also in this configuration, when writing is performed to the memory cell, the potential at the interface M4 between the lower layer insulating films 8A and 8B can be deeper than the potential at the interface M5 between the lower layer insulating film 8B and the intermediate insulating film 9, so that a charge "e" can hardly be accumulated at the interface M5, and leakage of the charge "e" accumulated in the floating gate electrode 12 can thereby be reduced.

Fourth Embodiment

Figure 7:
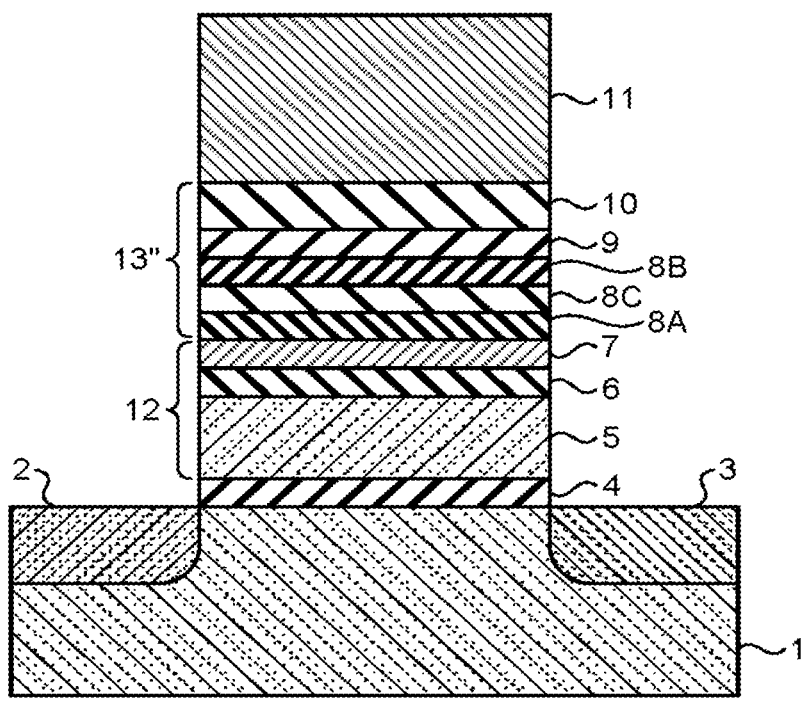
FIG. 7 is a sectional view showing the configuration of a memory cell, which is applied to a non-volatile semiconductor memory device according to a fourth embodiment.

FIG. 7 is a sectional view showing the configuration of a memory cell, which is applied to a non-volatile semiconductor memory device according to a fourth embodiment.

As shown in FIG. 7, in this configuration, an inter-electrode insulating film 13" is disposed in place of the inter-electrode insulating film 13' shown in FIG. 5. The inter-electrode insulating film 13" includes a lower layer insulating film 8C interposed between the lower layer insulating films 8A and 8B shown in FIG. 5. As the material of the lower layer insulating film 8C, a compound oxide of a first element and a second element may be used. In this case, the lower layer insulating film 8C may be made such that the ratio of the first element relative to the second element continuously increases in the direction from the lower layer insulating film 8A to the lower layer insulating film 8B.

For example, as the material of the lower layer insulating film 8C, HfSiO$_x$ may be used. Further, the lower layer insulating film 8C may be made such that the ratio of Si relative to Hf continuously increases in the direction from the lower layer insulating film 8A to the lower layer insulating film 8B. Here, as a method of disposing the lower layer insulating film 8C between the lower layer insulating films 8A and 8B, the lower layer insulating films 8A and 8B shown in FIG. 5 may be first formed and then subjected to a heat process, by which the first element is caused to diffuse to form the lower layer insulating film 8C.

Figure 8:
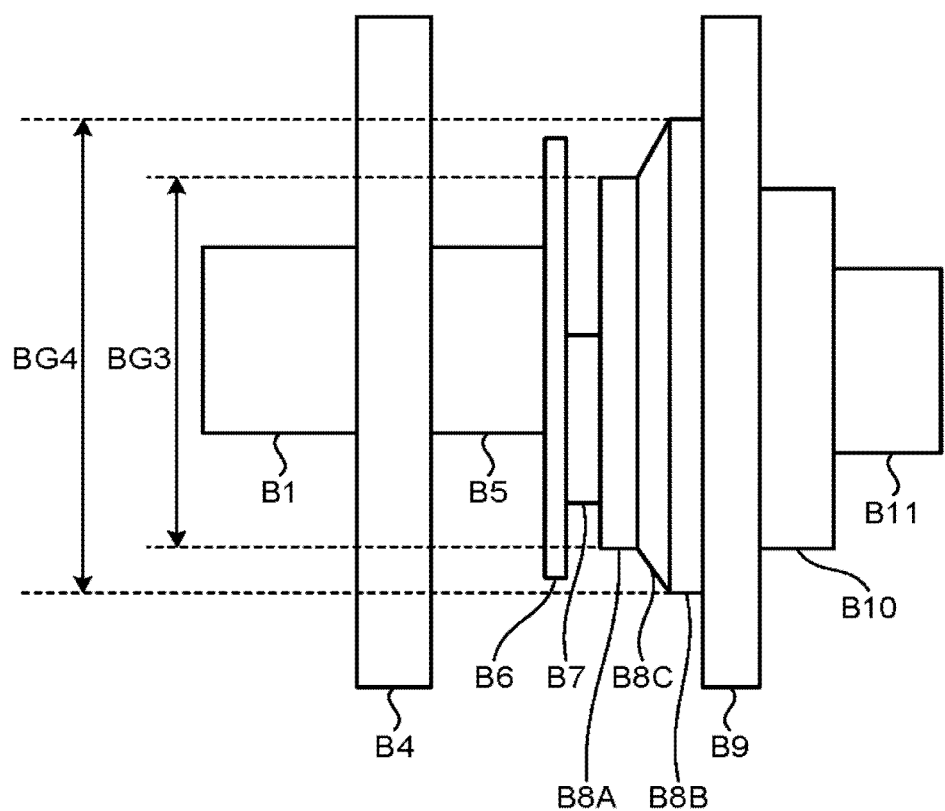
FIG. 8 is a view showing an energy band structure of the memory cell, which is applied to the non-volatile semiconductor memory device according to the fourth embodiment, obtained when no external electric field is applied.

FIG. 8 is a view showing an energy band structure of the memory cell, which is applied to the non-volatile semiconductor memory device according to the fourth embodiment, obtained when no external electric field is applied.

As shown in FIG. 8, the lower layer insulating film 8C has an energy band B8C. The other parts of the energy band structure are the same as those shown in FIG. 6. The band gap of the energy band B8C may be set to continuously increase in the direction from the band gap BG3 to the band gap BG4. Consequently, as compared with the configuration shown in FIG. 5, the trap level between the lower layer insulating films 8A and 8B can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
    a tunnel insulating film disposed on a semiconductor substrate;
    a floating gate electrode disposed on the tunnel insulating film;
    an inter-electrode insulating film disposed on the floating gate electrode; and
    a control gate electrode disposed on the inter-electrode insulating film,
    wherein the inter-electrode insulating film includes
    a first layer insulating film disposed on a side closer to the floating gate electrode,
    a second layer insulating film disposed on a side closer to the control gate electrode, and
    an intermediate insulating film interposed between the first layer insulating film and the second layer insulating film,
    wherein the intermediate insulating film contains a first element,
    the first layer insulating film contains the first element and a second element, such that a ratio of the first element relative to the second element is larger on a side closer to the intermediate insulating film than on a side closer to the floating gate electrode,
    wherein the floating gate electrode includes
    a first layer film disposed on a side closer to the tunnel insulating film,
    a second layer film disposed on a side closer to the inter-electrode insulating film, and containing a metal element, and
    an intermediate film interposed between the first layer film and the second layer film,
    wherein the second layer film has a larger potential depth with respect to a charge accumulated in the floating gate electrode, as compared with the first layer film,
    a diffusion constant of the metal element in the intermediate film is smaller than a diffusion constant of the metal element in the first layer film, and
    wherein the first layer film contains Si as a main component, the metal element is Ru, and the intermediate film is made of SiN.

2. The non-volatile semiconductor memory device of claim 1, wherein the first layer insulating film and the second layer insulating film respectively have dielectric constants higher than that of the intermediate insulating film.

3. The non-volatile semiconductor memory device of claim 2, wherein the ratio of the first element relative to the second element is 0% on the side closer to the floating gate electrode, and the ratio of the first element relative to the second element is 50% or more on the side closer to the intermediate insulating film.

4. The non-volatile semiconductor memory device of claim 2, wherein the ratio of the first element relative to the second element continuously increases in a direction from the side closer to the floating gate electrode to the side closer to the intermediate insulating film.

5. The non-volatile semiconductor memory device of claim 2, wherein the first layer insulating film has a band gap that is larger on the side closer to the intermediate insulating film than on the side closer to the floating gate electrode.

6. The non-volatile semiconductor memory device of claim 5, wherein the band gap continuously increases in a direction from the side closer to the floating gate electrode to the side closer to the intermediate insulating film.

7. The non-volatile semiconductor memory device of claim 2, wherein the intermediate insulating film has a larger barrier height, with respect to a charge accumulated in the floating gate electrode, than those of the first layer insulating film and the second layer insulating film.

8. The non-volatile semiconductor memory device of claim 2, wherein the intermediate insulating film is made of an oxide of the first element, and the first layer insulating film and the second layer insulating film are respectively made of oxides of the first element and the second element.

9. The non-volatile semiconductor memory device of claim 8, wherein the first element is Si, and the second element is Hf.

10. The non-volatile semiconductor memory device of claim 9, wherein the intermediate insulating film is made of SiO$_x$ ("x" is a positive real number), and the first layer insulating film and the second layer insulating film are made of HfSiO$_x$.

11. The non-volatile semiconductor memory device of claim 2, wherein the first layer insulating film includes
    a third layer insulating film disposed on a side closer to the floating gate electrode, and containing the second element but not containing the first element, and
    a fourth layer insulating film disposed on a side closer to the intermediate insulating film, and containing the first element and the second element.

12. The non-volatile semiconductor memory device of claim 11, wherein the first layer insulating film includes a fifth layer insulating film interposed between the third layer insulating film and the fourth layer insulating film, and containing the first element such that the first element continuously increases in a direction from the third layer insulating film to the fourth layer insulating film.

13. A non-volatile semiconductor memory device comprising:
- a tunnel insulating film disposed on a semiconductor substrate;
- a floating gate electrode disposed on the tunnel insulating film, and containing a metal element;
- an inter-electrode insulating film disposed on the floating gate electrode; and
- a control gate electrode disposed on the inter-electrode insulating film, wherein the inter-electrode insulating film includes
a first layer insulating film disposed on a side closer to the floating gate electrode,
a second layer insulating film disposed on a side closer to the control gate electrode, and
an intermediate insulating film interposed between the first layer insulating film and the second layer insulating film, wherein the first layer insulating film is arranged such that a part on a side closer to the intermediate insulating film has a lattice constant closer to that of the intermediate insulating film as compared with a part on a side closer to the floating gate electrode, wherein a diffusion constant of the metal element in a part of the first layer insulating film closer to the intermediate insulating film is smaller than a diffusion constant of the metal element in a part of the first layer insulating film closer to the floating gate electrode, wherein the first layer insulating film and the second layer insulating film respectively have dielectric constants higher than that of the intermediate insulating film, wherein the floating gate electrode includes
a first layer film disposed on a side closer to the tunnel insulating film,
a second layer film disposed on a side closer to the inter-electrode insulating film, and containing the metal element, and
an intermediate film interposed between the first layer film and the second layer film, and wherein the second layer film has a larger potential depth with respect to a charge accumulated in the floating gate electrode, as compared with the first layer film, and a diffusion constant of the metal element in the intermediate film is smaller than a diffusion constant of the metal element in the first layer film.

14. The non-volatile semiconductor memory device of claim 13, wherein the intermediate insulating film has a larger barrier height, with respect to a charge accumulated in the floating gate electrode, than those of the first layer insulating film and the second layer insulating film.

15. The non-volatile semiconductor memory device of claim 13, wherein the first layer insulating film has a band gap that is larger on the side closer to the intermediate insulating film than on the side closer to the floating gate electrode.

16. The non-volatile semiconductor memory device of claim 15, wherein the band gap continuously increases in a direction from the side closer to the floating gate electrode to the side closer to the intermediate insulating film.

* * * * *